US 7,557,655 B2

(12) United States Patent
Minteer

(10) Patent No.: US 7,557,655 B2
(45) Date of Patent: Jul. 7, 2009

(54) SYSTEMS AND METHODS FOR ISOLATING AN ANALOG SIGNAL

(75) Inventor: Timothy M. Minteer, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 95 days.

(21) Appl. No.: 11/935,204

(22) Filed: Nov. 5, 2007

(65) Prior Publication Data

US 2009/0115509 A1    May 7, 2009

(51) Int. Cl.
    *H03F 1/00* (2006.01)
(52) U.S. Cl. ...................................... 330/195; 330/188
(58) Field of Classification Search .................. 330/195, 330/165, 188
    See application file for complete search history.

(56) References Cited

U.S. PATENT DOCUMENTS

| | | |
|---|---|---|
| 3,940,678 A | 2/1976 | Koyama |
| 4,025,849 A | 5/1977 | Nihashi et al. |
| 4,066,974 A | 1/1978 | Reinhard |
| 4,068,135 A | 1/1978 | Sonobe et al. |
| 4,152,660 A | 5/1979 | Olschewski |
| 4,286,225 A | 8/1981 | Morong |
| 4,317,963 A | 3/1982 | Chea, Jr. |
| 4,506,230 A | 3/1985 | Ashley-Rollman |
| 4,700,174 A | 10/1987 | Sutherland et al. |

(Continued)

FOREIGN PATENT DOCUMENTS

JP    09236624 A    9/1997

(Continued)

OTHER PUBLICATIONS

PCT/US2008/082213, Feb. 1, 2009, From the International Searching Authority, Notification of Transmittal of the International Search Report and the Written Opinion of the International Searching Authority, or the Declaration, Applicant: Schweitzer Engineering Laboratories, Inc., Date of Mailing: Jan, 2, 2009.

(Continued)

*Primary Examiner*—Henry K Choe
(74) *Attorney, Agent, or Firm*—Eugene M. Cummings, P.C.

(57) ABSTRACT

An accurate linear equivalent of an analog signal may be produced across an isolation barrier by driving a primary transformer winding with a drive amplifier and compensation amplifier, where the compensation operational amplifier amplifies a difference between a signal produced on a sense winding of the transformer and a combination of the input analog signal and output of the drive amplifier. The system may be stabilized by a lead-lag network between the sense winding, input signal, and operational amplifier. The transformer may comprise an isolation barrier to isolate the input analog signal from a signal winding. The primary winding of the transformer, driven by the operational amplifier and driver amplifier circuit, may produce a linear equivalent of the input analog signal across the isolation barrier on a signal winding of the transformer. The transformer may comprise power supply windings connected to a power supply bridge rectifier and regulator circuit to control and supply power to the circuit components across the isolation barrier. The operational amplifier and drive amplifier circuit may be active for only a portion of each analog signal sampling period. The control signals may provide power during the rest of the sampling cycle.

25 Claims, 4 Drawing Sheets

U.S. PATENT DOCUMENTS

| | | | |
|---|---|---|---|
| 4,740,744 A | | 4/1988 | Lubarsky |
| 4,797,627 A | | 1/1989 | Chism et al. |
| 4,949,030 A | | 8/1990 | Tse |
| 4,970,459 A | | 11/1990 | Germer |
| 5,767,744 A | * | 6/1998 | Irwin et al. ............... 330/297 |
| 6,392,476 B1 | * | 5/2002 | Rodriguez ............... 330/10 |
| 6,737,916 B2 | * | 5/2004 | Luu ............... 330/10 |
| 7,106,048 B1 | | 9/2006 | Feight et al. |
| 7,271,580 B1 | | 9/2007 | Fenske et al. |

FOREIGN PATENT DOCUMENTS

WO    WO 2005/008692 A2    1/2005

OTHER PUBLICATIONS

PCT/US2008/082219, Aug. 1, 2009, From the International Searching Authority, Notification of Transmittal of the International Search Report and the Written Opinion of the International Searching Authority, or the Declaration, Applicant: Schweitzer Engineering Laboratories, Inc., Date of Mailing: Jan. 8, 2009.

* cited by examiner

SYSTEMS AND METHODS FOR ISOLATING AN ANALOG SIGNAL

TECHNICAL FIELD

This disclosure relates generally to isolating an analog signal and, more specifically, to systems and methods for accurately measuring an analog signal isolated across an isolation transformer.

BRIEF DESCRIPTION OF THE DRAWINGS

Additional aspects and advantages will be apparent from the following detailed description of preferred embodiments, which proceeds with reference to the accompanying drawings, wherein.

DETAILED DESCRIPTION OF PREFERRED EMBODIMENTS

Figure 1:
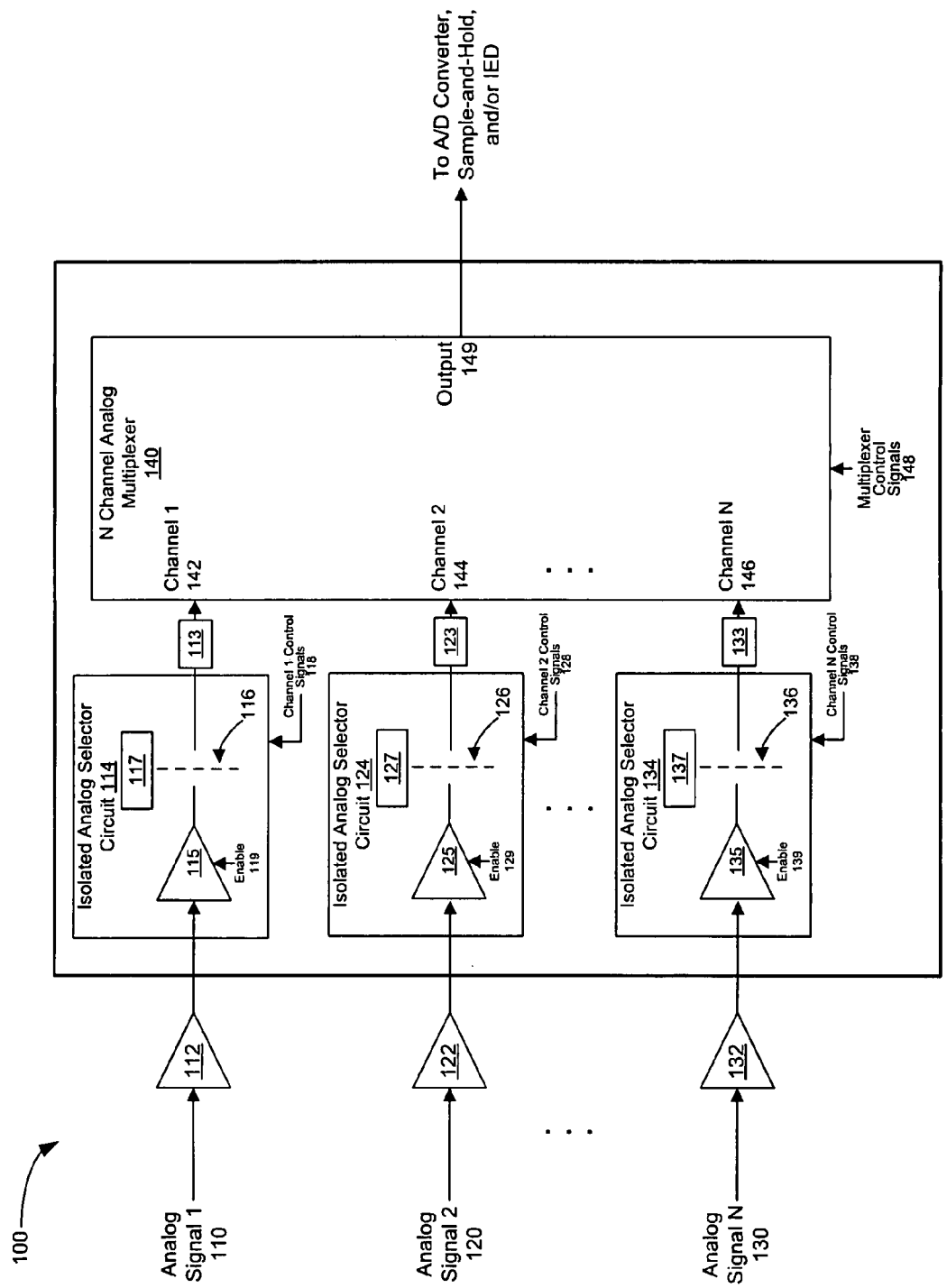
FIG. 1 is a block diagram of one embodiment of a plurality of isolated analog circuits coupled to an analog multiplexer and analog to digital converter.

Analog acquisition systems play a critical role in many different systems, including: power utility protection systems; Supervisory Control and Data Acquisition (SCADA) systems; and a large number of other control and data acquisition systems in various fields (e.g., automotive, industrial, medical, and the like). For example, a power utility and/or transmission system may comprise various devices that use analog acquisition systems, including: monitoring devices; system control devices; metering devices; and protective devices (e.g., protective relays). In most cases, these devices are microprocessor-based or "intelligent electronic devices" (IEDs), such as protective relays, communications processors, phasor measurement units, digital fault recorders, and the like.

IEDs may require accurate analog measurements in order to properly monitor, control, meter, and/or protect a power system. Recent advancements in phase-magnitude measurement technology with respect to time stamping and/or time alignment of such measurements have made new monitoring, control, protection, and/or metering functions feasible. One such technology comprises generating so-called synchrophasor measurements according to the teachings of United States Patent Application Pub. No. 2007/0086134, entitled "Apparatus and Method for Estimating Synchronized Phasors at Predetermined Times Referenced to an Absolute Time Standard in an Electrical System" to Zweigle et al., which is herein incorporated by reference in its entirety.

Generally, analog acquisition systems require some form of isolation between the analog signal to be measured and the digital control system and/or IED performing the measurement. The isolation may be needed for safety reasons as well as protection of the digital control system and/or IED from damage due to transient conditions in the power system (e.g., voltage/current spikes, faults, or the like). For example, an IED in a power system, such as a digital protective relay, may require 3 kV of isolation at 60 Hz between the current transformer (CT) and voltage transformer (VT) signals and the digital control circuitry acquiring the measurement.

Isolation between the input analog signal and IED may prevent direct electrical communication between the input analog signal and the IED. Accordingly, as used herein, this isolation may refer to "electrical isolation" or simply "isolation." Although electrically isolated, an analog signal may be in electromagnetic communication with an IED performing a measurement of the input analog signal. For example, an IED may measure a magnetic field produced by the analog signal and/or may generate a current and/or voltage from the magnetic field. In this case, the IED may not be in electrical communication with the input analog signal, but may measure the signal via electromagnetic communication.

Such isolation may be achieved by using an isolation transformer. An isolation transformer may comprise a primary winding and a secondary winding (signal winding) insulated from one another to meet the isolation requirements of the system. The input analog signal may drive the primary winding, and the measuring device (e.g., IED) may acquire the signal at the signal winding. The transformer may be designed to support the current or voltage range of the input analog signal as well as the frequency of the analog signal. The primary winding may be electrically coupled to the analog signal, and the signal winding may be electrically coupled to the acquisition system. The output of the signal winding may be a linear representation of the primary analog signal. As such, ideally, the output should have the same frequency, a proportional magnitude, and a consistent phase delay with respect to the primary signal.

One such transformer is a so-called "iron-core" transformer, which may comprise an iron-based core to isolate a 60 Hz CT or VT signal. The transformer core may be physically large enough to support the largest waveform that is to be measured. However, this type of isolation transformer has several drawbacks: first, for large fault currents, which may have a fully decaying direct current offset, the isolation transformer may saturate; second the transformer may become non-linear for low CT signals; and third, the phase through the isolation iron-based core transformer may not be consistent from part to part or over the entire range of the CT signal.

The construction of transformers having an iron-based core may be a manual labor intensive process. For instance, during construction, the pieces of the core laminates must be forced into bobbins, and insulation tape must be added between the primary and secondary magnetic wire layers. The magnetic wires must then be soldered to lead wires or binding post to provide the interface for crimp terminals or wave soldering on a printed circuit board (PCB). The resulting transformer system may be impregnated or dipped in varnish to protect the magnetic wires and other components from the environment. All of these manual steps in the construction process of an iron-based core transformer may adversely impact its quality and reliability and increase its cost.

Another issue with iron-based core isolation transformers is the weight they may add to a device. For instance, a digital protective relay and/or IED, may comprise numerous isolation transformers which may weigh approximately ⅔ pounds each. This may represent a significant portion of the total weight of the IED and may complicate installation and/or maintenance of the IED.

In some cases, the analog signal to be isolated may be at a very low frequency (e.g., a power, frequency, and/or temperature transducer signal). Conventional isolation transformers, such as an iron-core isolation transformer, may not be capable of isolating the signal. Instead, for these types of signals, non-galvanic isolation may be achieved with a operational and/or differential amplifier circuit, or galvanic isolation may be achieved with an isolation amplifier. Both methods have drawbacks. A differential amplifier may not provide a galvanic isolation and may have poor common mode rejection since common mode rejection is mainly a function of how closely matched the circuit resistances are. Isolation amplifiers are typically costly and may require a power supply on both sides of the isolation module.

Many acquisition systems require a high degree of accuracy for the sampled isolated analog signals. For example, some IEDs, such as a digital protective relay, may incorporate a 16-bit, analog-to-digital (A/D) converter. Such an IED may require the measured precision of the voltage and/or current signals to be within a few counts of the A/D converter (i.e., within 1 to 2 bits of precision of the A/D converter). It may also be important that this accuracy is maintained over operating temperature extremes of the acquisition system.

Conventional differential amplifiers and isolation amplifiers may not be capable of achieving the required level of accuracy. Further, if a traditional isolation amplifier system were to be constructed to the tolerances required to achieve higher precision, it would result in significantly increased cost, potentially many times that of a conventionally construed iron core CT or VT system.

Typical acquisition systems incorporate a single A/D converter and/or other capture circuitry to sequentially sample every analog signal in the system in a round-robin type fashion. For example, an IED monitoring a three-phase power system captures four current (CT) signals ($I_A$, $I_B$, $I_C$, and $I_N$) and three voltage (VT) signals ($V_A$, $V_B$, and $V_C$). In this case, the IED may sequentially sample $I_A$, $I_B$, $I_C$, $I_N$, $V_A$, $V_B$, and $V_C$ and then repeat the process.

As used herein, "capture circuitry" may refer to any circuitry and/or system capable of capturing an analog signal including, but not limited to: an analog-to-digital converter; sample-and-hold circuitry; a switching capacitor; an analog memory; or the like. Although the disclosure discusses the use of particular capture circuitry implementations (e.g., and A/D converter), one skilled in the art would recognize that the teachings of this disclosure may be used with any capture circuitry. As such, this disclosure should not be read as limited to any particular capture circuitry implementation.

In a sequential sampling system, 192 samples per 60 Hz cycle for each of 16 analog signals (channels) may be obtained using a single A/D converter. Typically, an A/D conversion may be performed in 5 microseconds. As such, each signal may need to be valid for 5 microseconds during each 87 microsecond period $$\left(\frac{1}{60*192} \cong 87 \text{ }\mu\text{sec}\right)$$

for conversion by the A/D converter. Accordingly, an analog isolation circuit of this disclosure may only drive the analog signal across the isolation barrier for the time required for the sample capture to take place (e.g., 5 microseconds per 87 microsecond period). This may allow the transformer of this disclosure to be smaller and more efficient that a transformer that constantly maintains the analog signal across the isolation barrier.

The analog signal isolator of this disclosure may only bring the analog signal across the isolation barrier for the portion of time that it is needed by the A/D converter. As such, the isolation transformer of this disclosure may be significantly reduced in size and weight. For instance, in a digital protective relay IED, only a small fraction (e.g., $\frac{1}{1000}^{th}$) of the magnetics may be required.

Another issue prevalent in typical isolation transformers is poor accuracy. As discussed above, an isolation transformer may operate using an input analog signal to drive a primary transformer winding in electromagnetic communication with a signal winding to create a linear approximation of the analog input. However, error may be created since the input signal may change as the input analog signal magnetizes the primary winding of the transformer (e.g., a voltage drop may occur as the magnetizing current ramps up). Additional error may be created by series resistance as the analog input signal is switched on and off and/or connected. In addition, the amount of magnetizing and other resistance may vary depending upon the electrical components used in the isolation transformer and the ambient temperature (e.g., the electrical components may change their resistance and/or reactance with temperature).

Due in part to these errors, a conventional transformer would likely perform poorly in a system according to the teachings of the disclosure where the analog input signal is switched on and off depending upon which analog signal is being measured at a particular sample time (e.g., switched on for 5 microseconds during each 87 microsecond measurement period).

Some isolation transformers have attempted to address accuracy issues in the output signal. For example, some systems have attempted to compensate for the magnetizing voltage drop by sampling the output analog signal twice and estimating the actual measurement value from the two samples. However, the precision of the estimation algorithm may be lacking due to variance of when the actual times the signal is sampled. Additionally, the accuracy of the system may vary significantly due to, among other things: temperature swings; changes in transformer permeability; and transients when a particular analog input signal is switched to the transformer (the switching is not a simple step function and, as such, cannot be accurately estimated using two measurements).

In another approach, a third transformer winding (referred to herein as a "sense winding") may be used to estimate the voltage drop error created by magnetizing current generated during primary winding ramp up. A compensation operational amplifier (op amp) may be used to amplify a difference between an input analog signal and the output of the sense winding. However, this approach may introduce unacceptable errors for a precision acquisition system. First, the op amp's output impedance in combination with the series resistor of the output filter and analog switch may cause the closed loop gain of the compensation op amp to be significantly reduced when driving the magnetizing inductance load of the primary winding. This reduction may result in error on the output signal. Second, stabilizing feedback used with the compensation op amp (e.g., a capacitor from the output of the op amp to the negative input of the op amp) may produce an effectively direct current as the op amp ramps up. This current may flow through an input resister connected to the negative input of the amplifier, creating additional error. Third, the closed loop settling response of the op amp when the output is connected to the isolation transformer and/or any switching transients that occur when any of the analog switches are modified may impact both the average signal level present on the output capacitors (error with respect to the input signal) as well as transient perturbations around the average signal level. Fourth, error due to mismatch of magnetic coupling between the isolation transformer's primary-sense and primary-signal windings may exist. Each of these errors may vary with different transformer configurations and circuit components and will significantly vary over temperature swings.

In addition, these systems may require a separate transformer to supply power to the op amp across the isolation barrier and to communicate control signals to its analog switches. Further, given the non-settling transients created by the op amp, there may be no ideal output signal sampling time.

In yet another approach, additional transformer windings may be provided to act as a power supply for the compensation op amp across the transformer isolation barrier. The system may still suffer, however, from unacceptable precision errors due to other circuit components, such as a flyback modulator/demodulator used to provide power. In particular, the system's closed loop response may suffer from gain loss as the magnetizing current ramps up in the primary winding, and un-settling transients may be created due to its switching action. In addition, error may be created between flyback demodulators in both the feedback loop of the op amp and in the output signal. Like the other systems discussed above, these errors may vary with different transformer and circuit components, and may significantly vary over temperature swings.

The isolation transformer of this disclosure may address the weight penalty and precision lacking in conventional isolation transformer systems. First, since the isolated analog selector of this disclosure only brings the analog signal across the isolation barrier for the period of time it is needed by the A/D converter, the transformer may be reduced in size and weight. The precision errors of conventional systems may be addressed in a number of ways. First, a compensation op amp may be used to drive, through a drive amplifier, the isolation transformer's primary winding with negative feedback from a tertiary (sense) winding to compensate for any voltage drop that would normally occur as magnetizing current flows through the series resistance of the output stage (of the op amp) and primary winding. Second, a drive amplifier may directly drive the primary winding and be controlled by the compensation op amp. The drive amplifier may be designed to have minimal output impedance such that the net resistance between the drive amplifier and the isolation transformer inductance is reduced to substantially the primary winding resistance. The compensation op amp feedback loop may be stabilized by a lead-lag compensation network. The output signal may be stabilized with a snubber.

Turning now to FIG. 1, a block diagram of one embodiment of an isolated analog signal capture system 100 is depicted. As discussed above, an analog signal capture system 100 of this disclosure may monitor a plurality of analog signals corresponding to voltage and/or current phase components of a three-phase electrical power system. Accordingly, embodiment 100 depicts an analog signal multiplexer capable of multiplexing N analog signals where N may represent the number of analog signals to be acquired (e.g., 16 analog signals).

Embodiment 100 may receive N analog signal inputs including, 110, 120, and 130. Analog signal input 110 may pass through low pass filter (LPF) 112. LPF 112 may prevent aliasing from occurring due to the A/D sampling process. LPF 112 may be used because analog signal one (1) 110 may comprise high-frequency components that are not to be measured (e.g., signal one (1) 110 may include glitching and/or noise). As such, if analog signal one (1) 110 where to be sampled at a frequency that is too low to reconstruct these high frequency components, the low-frequency aliases of the undersampled high frequencies may appear in the signal, causing error. Therefore, LPF 112 may remove high frequency components before the sampling is done. Similar LPF filters 122 and 132 may be used in conjunction with the other analog signal inputs 120 through 130.

The output of LPF 112 may flow to isolated analog selector circuit 114 which may generate a precise linear representation of the filtered analog input signal 110 across isolation barrier 116 to sample-and-hold 113 and the N channel analog multiplexer 140 for the portion of time when the A/D converter (not shown) is performing a capture of the signal on channel one (1) 142. Similarly, the output of LPF 122 may flow to isolated analog selector circuit 124, and the output of LPF 132 may flow to isolated analog selector circuit 134.

Analog selector circuit 114 may comprise analog buffer 115 which may be enabled for the time required for the A/D conversion of analog signal one (1) 110 as well as some time prior to the capture to allow the isolation circuitry to settle. As such, analog buffer 115 may receive an input enable signal 119 derived from channel one (1) control signals 118. Channel one (1) control signals 118 may be derived from and/or related to multiplexer control signals 148 such that analog buffer 115 is enabled while channel one (1) 142 input of analog multiplexer 140 is selected. Similarly, analog selector circuits 124 and 134 may comprise analog buffers 125 and 135 driven by an enable signal 129, 139. Enable signals 129 and 139 may be derived from their respective channel control signals 128 and 138 and may cause analog buffers 125 and 135 to be enabled during and/or prior to the selection of channel 2 144 and channel N 146, respectively.

Each analog selector circuit 114, 124, 134 may comprise an isolation barrier 116, 126, 136 to individually isolate each filtered analog signal 110, 120, 130 from sample-and-hold circuitry 113, 123, 133, the multiplexer 140, sample-and-hold system (not shown) and/or A/D converter (not shown), and the IED (not shown). As discussed above, this may prevent transients, faults, and/or glitches on analog inputs 110, 120, or 130 from damaging the multiplexer 140, A/D converter and/or IED.

Sample-and-hold circuits 113, 123, and 133 may sample and hold the output of isolated analog selector circuits 114, 124, 134 while multiplexer 140 selects one of its N inputs 142, 144, and 146. In some embodiments, multiplexer 140 may comprise an A/D converter and changes on other inputs, 142, 144, and 146 may create error in the conversion of the input selected by control signal 148. As such, sample-and-hold circuits 113, 123, 133 may be used hold the inputs 142, 144, 146 of multiplexer 140 constant while the A/D conversion (or other capturing method) takes place. Of course, in other embodiment, where the multiplexer 140 does comprise an A/D converter and/or is unaffected by changes to inputs 142, 144, or 146 during conversion, sample-and-hold circuits 113, 123, 133 may not be needed.

Multiplexer 140 may receive multiplexer control signals 148 which may direct multiplexer 140 to select one of input channels 142, 144, through 146 on output 149. Multiplexer control signals 148 may determine and/or correspond to channel control signals 118, 128, 138 and/or analog buffer enable signals 119, 129, 139 such that when a particular input 142, 144, or 146 is active, the corresponding control signal 118, 128, 138 and/or enable signal 119, 129, 139 is similarly active.

Output 149 of multiplexer 140 may flow to an A/D converter which may produce a digital equivalent of the analog signal 110, 120, or 130. As discussed above, the A/D converter may be communicatively coupled to an IED which may use the digital equivalent of the analog signal as part of a monitoring, metering, and/or protective function. In addition, the IED may transmit the measurement, and corresponding time stamp, to a remote IED.

In an alternative embodiment, output 149 of multiplexer 140 may flow to another capture and/or sampling system, including, but not limited to: a sample-and-hold circuit; a switching capacitor; or the like. As such, this disclosure should not be read as limited to any particular capture and/or sampling mechanism.

As can be seen in FIG. 1, only one of the analog signals 110, 120, 130 need pass through the isolation barrier 116, 126, 136 at any particular sampling time. As such, embodiment 100 may be optimized such that the buffers on the "left hand" side of the isolation barrier (e.g., buffers 115, 125 and 135), may only be powered and/or enabled during the sampling time for the particular analog signal 110, 120, 130. As discussed above, since the output of each isolation transformer circuit 114, 124, 134 need only be valid when the output is captured by the A/D converter, the isolation transformer circuits 114, 124, 134 may consume less power and comprise fewer magnetics than similar isolation transformers that must constantly maintain a valid output signal.

Isolated analog selector circuits 114, 124, and 134 may further comprise a power supply 117, 127, and 137. Power supply 117 may comprise a forward converter/push-pull switching power supply and may produce the voltage rails necessary for LPF 112 and analog buffer 115 and other circuitry of isolated analog selector 114. Power supply 117, 127, 137 may comprise energy storage means including, but not limited to, one or more capacitors, a battery, or the like.

Figure 2:
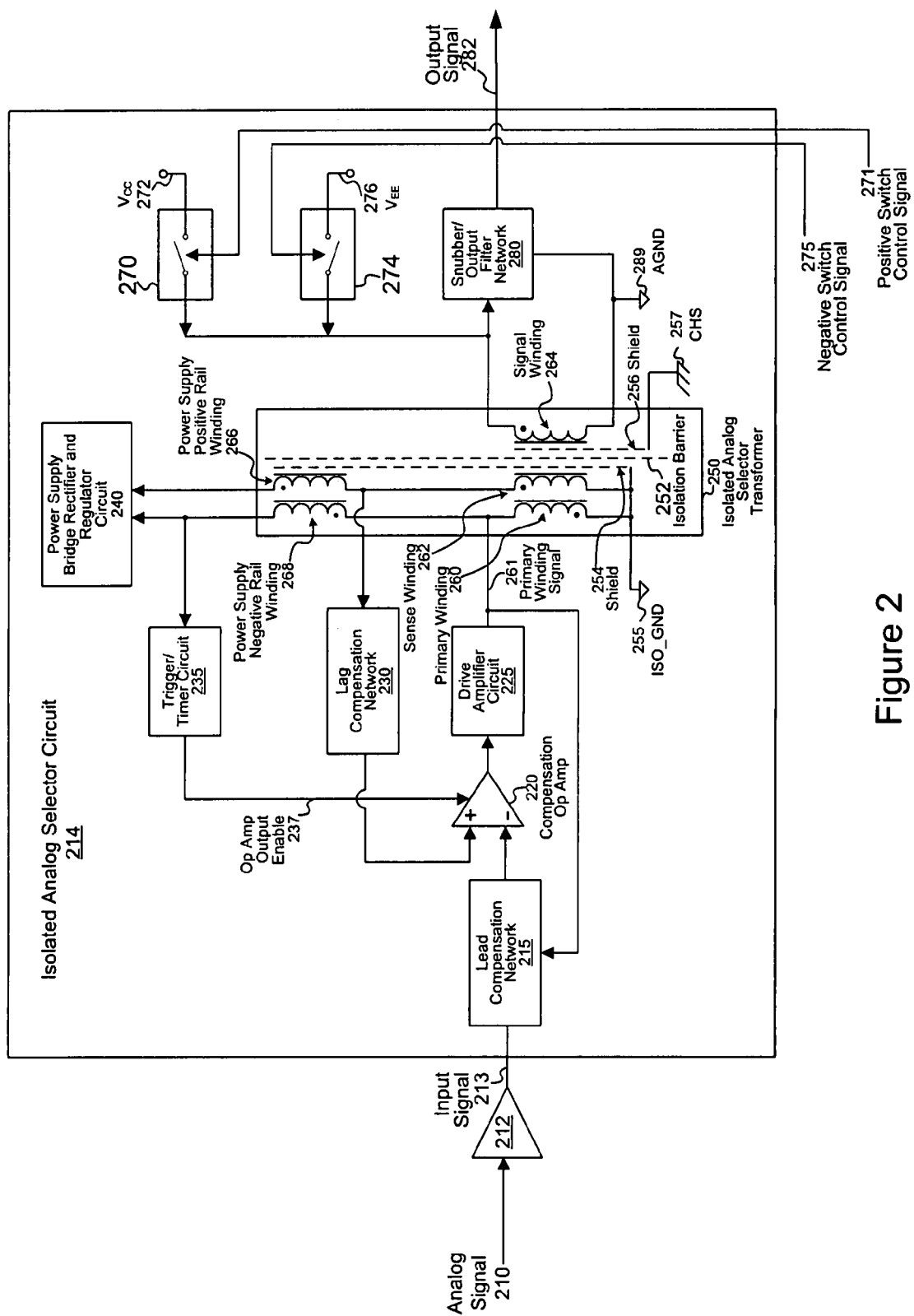
FIG. 2 is a block diagram of one embodiment of an isolated analog circuit.

Turning now to FIG. 2, a block diagram of one embodiment of an isolated analog selector circuit 214 is depicted. The isolated analog selector circuit 214 depicted in FIG. 2 may correspond one or more of the isolated analog circuits 114, 124, 134 of FIG. 1.

As discussed above, isolated analog selector circuit 214 may receive an analog input 213 which may be derived from an analog signal 210 processed by a LPF 212. Although the electrical communication is not shown, LPF 212 may be powered by power supply bridge rectifier and regulator circuit 240. LPF 212 may comprise any LPF implementation known in the art.

The analog input 213 may flow through lead compensation network 215 to a negative input of compensation operational amplifier (op amp) 220. The positive input of the op amp 220 may be formed by an output of a sense winding 262. Lag compensation network 230 may be used to process an output of sense winding 262. The signal produced on sense winding 262 may comprise negative feedback to compensation operational amplifier 220. The design and operation of lead compensation network 215 and lag compensation network 230 is discussed in more detail below in conjunction with FIG. 4.

Compensation op amp 220 may generate primary winding signal 261 to drive primary winding 260 of the isolation analog selector transformer 250. In the FIG. 2 embodiment, signal 261 may be generated by drive amplifier circuit 225. In an alternate embodiment (i.e., where compensation op amp has low output impedance), compensation op amp 220 may directly drive primary winding 260 with primary winding signal 261. Primary winding 260, sense winding 262, and primary faraday shield 254 may terminate at isolated ground (ISO_GND) 255. Compensation op amp 220 may be controlled by enable signal 237. When enabled by 237, compensation op amp 220 may drive primary winding 260 with the difference between the filtered input analog signal 213 as processed by lead compensation network 215 and the output of the sense winding 262 and input analog signal as processed by lag compensation network 230.

Drive amplifier circuit 225 may have minimal output impedance such that the net resistance between the drive amplifier 225 and the isolation transformer magnetizing inductance is basically the primary winding resistance. Accordingly, the closed loop gain of the compensation op amp 220 and adjoining circuitry may be maintained at a sufficiently high gain such that any error is within acceptable margins (e.g., within two counts of a 16-bit A/D converter). As discussed above, this may prevent error due to reduced gain caused by such resistance. In other embodiments, drive amplifier 225 may be incorporated in the integrated circuits of compensation op amp 220.

Compensation op amp 220 may use negative feedback from sense winding 262 of isolated analog selector transformer 250 to compensate for the voltage drop that would otherwise occur when isolation transformer magnetizing inductance current flows (ramps up) through the series resistance of the output stage and primary winding 260. This may cause the output of the signal winding 264 to be an accurate scaled linear representation of input signal 213. Accordingly, the use of compensation op amp 220 may increase the accuracy of the isolated analog selector circuit 214.

Primary winding signal 261 may drive primary winding 260. In one embodiment, signal 261 may be produced directly by compensation op amp 220. In the FIG. 2 embodiment, primary winding signal 261 may be generated by drive amplifier circuit 225. Drive amplifier 225 may be controlled by compensation op amp 220 (i.e., the output of compensation op amp 220 feeds into drive amplifier circuit 225). As discussed above, drive amplifier 225 may be configured such that the closed loop gain of the compensation op amp 220 is maintained at a high enough level that the corresponding error is in an acceptable range (e.g., one ore two counts of a 16-bit A/D converter).

Compensation op amp 220 may be stabilized by lag compensation network 230 and lead compensation network 215. Lag compensation network 230 may be disposed between sense winding 262 and the positive input of compensation op amp 220. The output of lag compensation network 230 may represent negative feedback to compensation op amp 220 since the sense winding 262 may be inverted relative to the primary winding 260. Lead compensation network 215 may be disposed between the output of the drive amplifier circuit 225 and the negative input of compensation op amp 220 such that when the output of the drive amplifier circuit 225 is ramping up, any corresponding capacitance current may not introduce error. Lead compensation network 215 and lag compensation network 230 may form a lead-lag compensator network as is well known in the control system arts. As such, lead and lag compensation networks 215, 230 may introduce a pole-zero pair into the open loop transfer function of compensation op amp 220 and drive amplifier circuit 225 to increase the responsiveness and stability of the system. Implementation details for lead compensation network 215 and lag compensation network 230 are provided below in conjunction with FIG. 4.

Signal winding 264 may be in electromagnetic communication with primary winding 260 across isolation barrier 252 and faraday shields 254 and 256. Faraday shield 256 may be electrically connected to a chassis 257. Signal winding 264 may terminate to analog ground (AGND) 289. As discussed above, isolation barrier 252 may be configured to isolate the analog input signal 213 from output signal 282. In embodiment 214, this may be done using isolated analog selector transformer 250. As discussed above, isolated analog selector transformer 250 may comprise primary winding 260 driven by compensation op amp 220 and drive amplifier circuit 225 which may be driven by the filtered analog input signal 213. Primary winding 260 may drive signal winding 264 to produce a scaled linear equivalent of filtered analog input signal 213 on signal winding 264. The negative feedback loop created using sense winding 262 and compensation op amp 220 may reduce error by compensating for the voltage drop that would otherwise occur as the magnetizing inductance current flows through the series resistance of the output stage and primary winding 260. As such, signal winding 264 may produce an accurate scaled linear equivalent of filtered analog input signal 213.

The output of signal winding 264 may flow to snubber/output filter network 280. Snubber/output filter network 280 may stabilize the compensation op amp circuitry by de-Qing the magnetization inductance and parasitic inductances and capacitances. Implementation details for one embodiment of snubber/output filter network 280 are provided below in conjunction with FIG. 4.

The output of snubber/output filter network 280 may form output signal 282 which may flow to an input of a multiplexer (not shown), A/D converter (not shown), and/or sample-and-hold circuitry (not shown). As discussed above, due to the negative feedback received from sense winding 262, compensation op amp 220 may drive primary winding 260 such that signal winding 264 may be a linear representation of input analog signal 213.

Signal winding 264 be driven by positive switch control signal 271 through forward converter power supply positive rail switch circuit 270 and/or may be driven by negative switch control signal 275 through forward converter power supply negative rail switch circuit 274. As will be discussed below in conjunction with FIGS. 3a and 3b, positive switch control signal 271 and negative control signal 275 may be used to control power to isolated analog selector circuit 214 across isolation barrier 252 using power supply bridge rectifier and regulator circuit 240. In this embodiment, control signals 271 and 275 may comprise alternating square wave signals to selectively connect signal winding 264 to a positive supply voltage and a negative supply voltage, creating alternating positive and negative pulses on positive and negative rail windings 266, 268.

In this embodiment, when the positive switch control signal 271 is high and/or asserted, forward converter power supply positive rail switch 270 may turn on (i.e., close), and positive voltage supply rail ($V_{CC}$) 272 may be applied to signal winding 264, producing a positive voltage on the power supply positive rail winding 266 and negative voltage on the power supply negative rail winding 268. Otherwise, when negative switch control signal 275 is high and/or asserted, forward converter power supply negative rail switch 274 may turn on (i.e., close), and negative voltage supply rail ($V_{EE}$) 276 may be applied to signal winding 264, producing a negative voltage on the power supply positive rail winding 266 and positive voltage on the power supply negative rail winding 268.

The alternating positive and negative voltage signals produced by $V_{CC}$ 272 $V_{EE}$ 276 and positive and negative switch control signals 271 and 275 may provide power to power supply bridge rectifier and regulator circuit 240 via signal winding 264 and positive and negative rail windings 266, 268. As discussed above, power supply bridge rectifier and regulator circuit 240 may power the circuitry of isolated analog selector circuit 214 across isolation barrier 252.

One skilled in the art would recognize that a single positive and/or negative rail winding could be used in conjunction with power supply bridge rectifier and regulator circuit 240 (e.g., a single power supply winding). As such, this disclosure should not be read as limited to any particular power supply generating means and/or power supply windings.

Positive and/or negative rail winding 268 may flow to trigger timer circuit 235 (FIG. 2 depicts only negative rail winding 268 flowing to trigger timer circuit 235). As will be discussed below in conjunction with FIG. 3, a rapid oscillation in positive and/or negative switch control signal 271 and/or 275 may cause trigger/timer circuit 235 to activate op amp output enable signal 237. The generation of the op amp output enable signal 237 will be discussed in greater detail in conjunction with FIGS. 3a and 3b below.

Figure 3A:
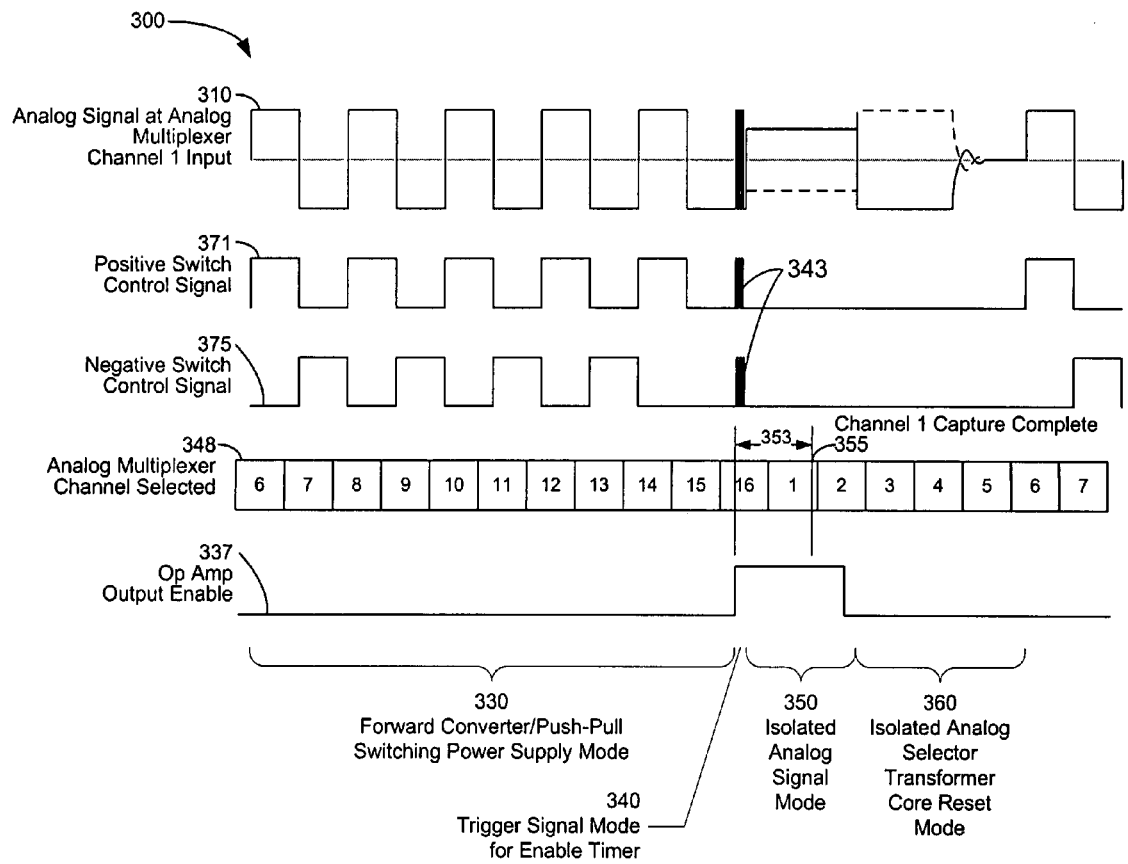
FIGS. 3a and 3b are block diagrams of control signals of an embodiment of an isolated analog circuit.
Figure 3B:
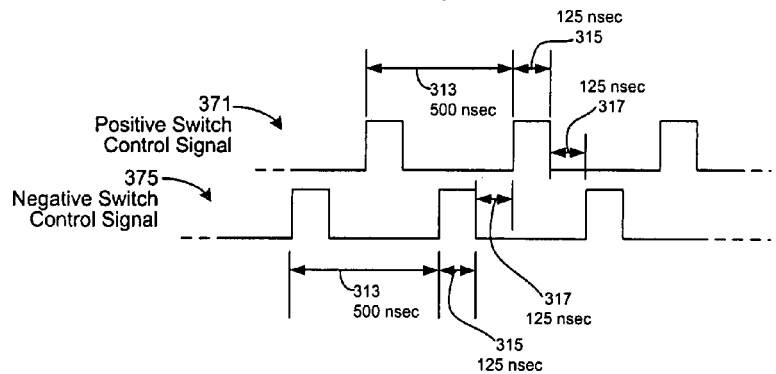

Turning now to FIGS. 3a and 3b, a timing diagram 300 of one embodiment of isolated analog selector circuit control signals is depicted. The control signals of FIGS. 3a and 3b may comprise control signals corresponding to channel one (1) 118 of isolated analog selector circuit 114 of FIG. 1. One skilled in the art, however, would understand that control signals 300 could be modified (e.g., shifted) to correspond to control signals for any channel two (2) through N of FIG. 1.

The control signals depicted in timing diagram 300 may relate to and/or be aligned with analog multiplexer channel control signal 148 of FIG. 1 (signal 348 in FIG. 3a). As such, the channel selected on analog multiplexer channel selected 348 may represent the selected input channel on multiplexer 140 of FIG. 1 (i.e., analog multiplexer channel selected 348 may represent multiplexer control signals 148 of FIG. 1).

The isolated analog selector circuit may have four modes of operation, forward converter/push-pull switching power supply mode 330, trigger signal mode for enable timer 340, isolated analog signal mode 350, and isolated analog selector transformer core reset mode 360. An embodiment of each of these modes, as well as the transition between modes, is depicted in timing diagram 300. As discussed above, although FIG. 3 depicts an exemplary timing diagram for an analog signal connected to channel one (1) the multiplexer of FIG. 1, timing diagram 300 could be adapted for use with any of the other channels two (2) through N by shifting the control signals 310, 371, 375, and 337 relative to the channel one (1) control signals.

The first operational mode of embodiment 300 may be the forward converter/push-pull switching power supply mode 330 which may occur while the multiplexer is selecting analog channel inputs 6-15 (e.g., as analog multiplexer channel selected signal 348 cycles from 6 to 15). During this mode 330, positive switch control signal 371 and negative switch control signal 375 may be alternately switched (i.e., when positive switch control signal 371 is high, negative switch control signal 375 is low and vice versa). These alternating pulses 371, 375 may flow to an isolated analog selector circuit similar to that depicted in FIG. 2. As discussed in conjunction with FIG. 2, positive and negative switch control signals 371, 375 may cause a signal winding of the isolated transformer to be alternately connected to a positive source rail voltage ($V_{CC}$) and a negative rail source voltage ($V_{EE}$), providing power to a switching power supply, such as power supply bridge rectifier and regulator circuit 240 of FIG. 2. Accordingly, during operational mode 330, energy may be fed into the isolated analog selector circuit connected to the control signals of timing diagram 300.

As shown in FIG. 3a, during the other operational modes of embodiment 300 (modes 340, 350, 360), positive switch control signal 371 and negative switch control signal 375 may not be active and/or may not operate to excite the switches of a connected isolated analog selector circuit. As such, the power supply component of the isolated analog selector circuit (e.g., elements 117, 127, 137 of FIG. 1 and/or element 240 of FIG. 2) may comprise energy storage, including, but not limited to: one or more capacitors; one or more batteries; or the like. This may allow the power supply to provide power to the isolated selector circuit components across the isolation barrier during its other operational modes (i.e., modes 340, 350, and 360).

In the FIG. 3a embodiment, trigger signal node 340 may occur at the beginning of the selection period of channel sixteen (16) on analog multiplexer channel selected signal 348. During this mode 340, positive switch control signal 371 and negative switch control signal 375 may rapidly oscillate at 343 as depicted in FIG. 3b. FIG. 3b shows positive and negative switch control signals 371 and 375 switched on for 125 nanoseconds (element 315 in FIG. 3b) over a period of 500 nanoseconds (element 313 in FIG. 3b) three consecutive times. The rise time of positive switch control signal 371 may be offset from the fall time of negative switch control signal 375 by 125 nanoseconds (element 317 in FIG. 3b) and vice versa.

The trigger/timer circuit of the isolated analog selector circuit (e.g., element 235 of FIG. 2), may detect this oscillation (343) on the power supply negative and/or positive rail winding, causing trigger/timer circuit to activate op amp output enable signal 337 and activate a timer. The timer may be activated for approximately 12 microseconds. During the timer period (e.g., 12 microseconds after detecting the pulses of 343), the trigger/timer circuit may assert the compensation op amp enable signal (element 237 of FIG. 2). When the op amp output enable signal is asserted, the isolated analog selector circuit may be in the third mode of operation, isolated analog signal mode 350.

Referring again to FIG. 2, It should be noted that the op amp enable signal 237 could be generated in many other ways aside from a rapid rise and fall on the negative and/or positive windings of the isolated analog selector transformer 250 including, but not limited to: an optical isolator (isolation barrier 252 bridged by light) originating from one of the channel control signals; capacitive or inductive coupled signals across a gap (isolation barrier 252 bridged by electric and/or magnetic fields); or the like. In addition, there are many other ways that the op amp output enable signal 237 could be triggered including, but not limited to, counting the cycles of the forward converter/push-pull switch power supply mode and triggering the output 237 after a pre-determined number of cycles, waiting a certain amount of time using a timer circuit, generating another type of pattern using the positive and/or negative switch control signals 271 and 275, or the like. As such, this disclosure should not be read as limited to any particular enable control signal isolation barrier 252 crossing method and/or technique or enable signal generation method and/or technique.

During isolated analog signal mode 350, the compensation op amp of FIG. 2 (element 220), may be activated by op amp output enable 337. Referring again to FIG. 2, the op amp output enable signal 237 may be produced by trigger/timer circuit 235 depicted in FIG. 2. While compensation op amp 220 is active, it may adjust its output until the signal at the sense winding 262 matches the input signal 213 from the LPF 212. Once the circuitry comprising compensation op amp 220, drive amplifier circuit 225, primary, sense, and signal windings 260, 262, 264, and lead and lag compensation networks 215, 230 settles, the output signal presented on the signal winding 264 and output 282 may be an accurate scaled linear representation of the input analog signal 213.

FIGS. 3a and 3b depict isolated analog signal mode 350 as occurring before the A/D capture complete time 355. The time differential 353 between the assertion of op amp output enable 337 and channel one (1) A/D capture may allow the circuitry of the isolated analog selector circuit to settle as described above. The delay 353 may allow the A/D converter to complete capture at 355 to occur with minimal and/or acceptable error (e.g., one or two counts of a 16-bit A/D converter).

After A/D conversion, control signals 300 may enter isolated analog selector transformer core reset mode 360. In the FIG. 3 embodiment showing control signals for channel one (1), this mode 360 may begin during the channel two (2) selection time and end with the selection time of channel five (5) on analog multiplexer channel selector signal 348. During mode 360, there may be no circuitry actively driving the transformer of the isolated analog selector circuit (e.g., the compensation co amp 220 enable signal 237, 337 may be de-asserted). Referring back to FIG. 2, any energy trapped and/or stored in the isolated analog selector transformer's 250 core may dump into the power supply bridge rectifier and regulator circuit 240. It is well known in the electrical arts that energy in a transformer 250 should not be allowed to build up without limit since such a build up may cause a core of transformer 250 to saturate and could damage the switches of 270, 274, components of power supply bridge rectifier and regulator 240, and/or drive amplifier circuit 225.

Referring again to FIGS. 3a and 3b, after the completion of mode 360 (i.e., after the capture of channel five (5) on analog multiplexer channel selection 348 has been completed), the system may return to operational mode 330 to repeat the above described control system cycle.

The timing and control signals 300 depicted in FIGS. 3a and 3b may correspond to channel one (1) of FIG. 2. However, one skilled in the art would recognize that the rest of the input signals two (2) through sixteen (16) could be derived from FIGS. 3a and 3b by shifting the timing and control signals 300 along analog multiplexer channel selected 348. For example, timing and control signals for channel two (2) could be derived by shifting timing and control signals to the right on FIG. 3a by one (1) selection period of analog multiplexer channel selected 348. Timing and control signals for other channels three through sixteen (16) could be derived by performing similar shifts. Although FIGS. 3a and 3b depict control signals corresponding to sixteen (16) analog signals, it would be understood by one stilled in the art that control signals for a system comprising any number of analog signals derived according to the teachings of this disclosure.

The timing signals depicted in FIGS. 3a and 3b could be generated by any control signal generating technique and/or methodology known in the art including, but not limited to: a state machine; a field programmable gate array (FPGA); an application specific integrated circuit (ASIC); a general and/or specific purpose computing device; or the like. As such, the control signals of this disclosure should not be read as limited to any particular control signal generating means, technique, and/or methodology.

In addition, in an alternative embodiment, sample-and-hold circuitry could be used before or after the analog multiplexer of FIG. 1 with the sampling completion occurring at time 355 of FIG. 3a.

Figure 4:
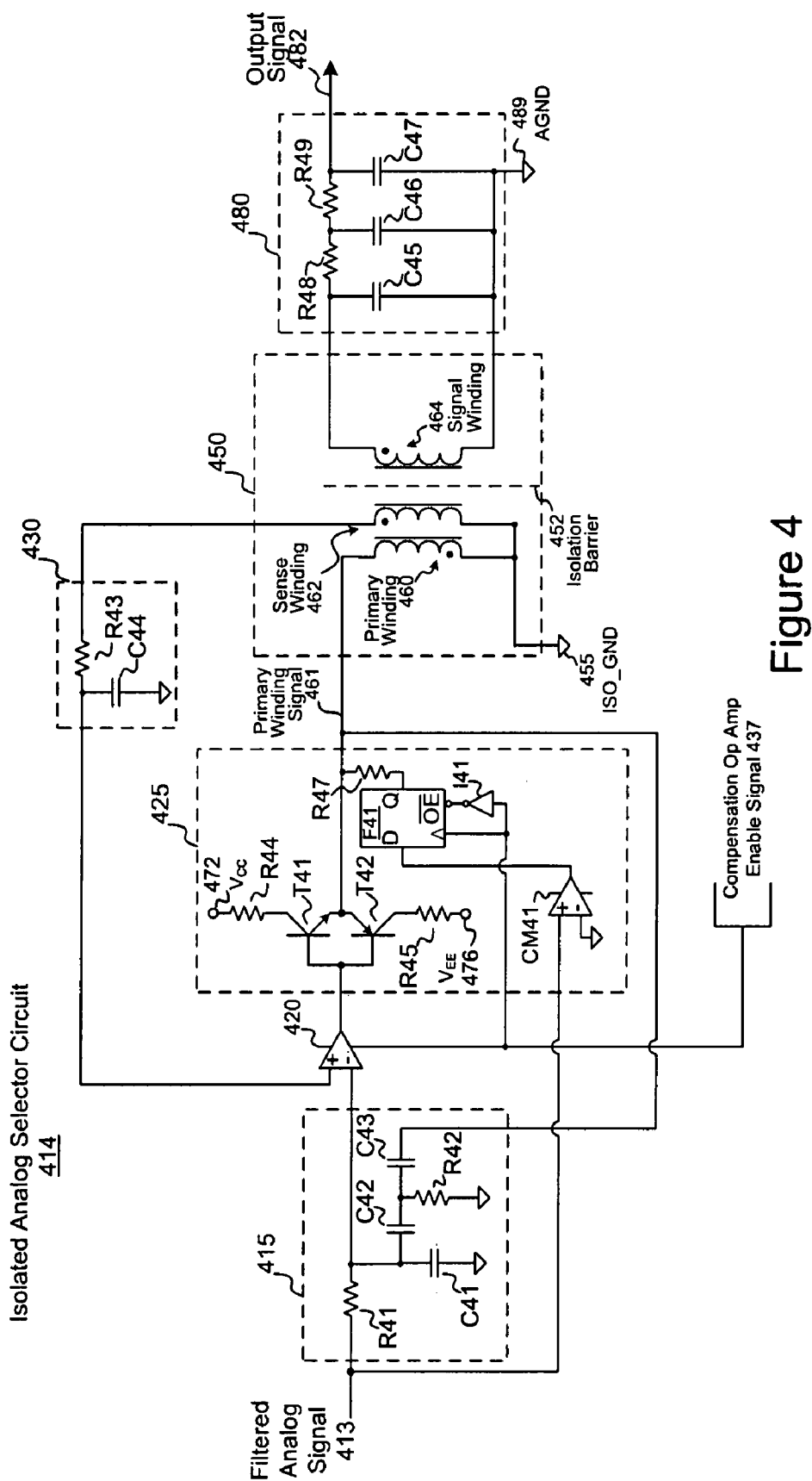
FIG. 4 is a circuit diagram of one embodiment of an isolated analog circuit.

Turning now to FIG. 4, a circuit diagram of one embodiment of an isolated analog selector circuit 414 is depicted. Embodiment 414 may comprise compensation op amp 420, which may be a high gain-bandwidth operational amplifier, such as, for example, an OPA357 manufactured by Texas Instruments®.

The sense winding 462 of the isolated analog transformer 450 may feed through lag compensation network 430 to the positive input of compensation op amp 420. This may create a negative feedback loop with compensation op amp 420 since the sense winding 462 has the opposite polarity of primary winding 460. Sense winding 462 and primary winding 460 may terminate at isolated ground (ISO_GND) 455. Signal winding 464 may terminate to analog ground (AGND) 489.

The output of compensation op amp 420 may flow to the input of drive amplifier circuit 425. Drive amplifier circuit 425 may comprise NPN T41 and PNP T42 transistors which may comprise a class B push-pull drive stage. Resistor R44 and R45 may limit the current of the drive stage under input signal over-voltage and/or over-current conditions. Since the class B stage of NPN transistor T41 and PNP transistor T42 may have some limitations when the input signal is near zero volts, resistor R47 may be pulled high (to $V_{CC}$) or low (to $V_{EE}$) by comparator CM41. This may provide bias to either NPN T41 or PNP T42 when the input to the drive amplifier circuit 425 is near zero volts and may maintain a low output impedance of drive amplifier circuit 425 for all voltage levels to drive primary winding 460. As discussed above, maintaining low output impedance between the drive amplifier 425 and primary winding 460 may maintain a high enough loop gain of compensating op amp 420 circuitry and, as such, may yield more a more accurate measurement.

Comparator CM41 and flip-flop F41 may determine whether R47 is pulled high or low at the point in time when the comparator op amp enable signal 437 is asserted—the op amp enable signal 437 may be connected to the "clock" and/or "latch" input of flip-flop F41. As such, the D input may determine the output on Q at the time the output enable signal 437 rises (e.g., creates a clock and/or latch signal). Resistor R47 may only be pulled high or low by comparator CM41 when the op amp enable signal is high, since the op amp enable signal 437 may be connected to the inverted output enable signal (shown in FIG. 4 passing through inverter 141) of flip-flop F41. As such, when output enable signal 437 is not asserted, the output of F41 may be tri-stated, which may cause R47 to be unconnected to or loading the primary winding 460.

The output of drive amplifier circuit 425 may form primary winding signal 461. Primary winding signal 461 may drive primary winding 460. Primary winding signal 461 may also be fed back into the negative pin of compensation op amp 420 through lead compensation network 415. As discussed above, in an alternative embodiment (e.g., where compensation op amp 420 comprises drive amplifier circuitry and/or has low output impedance), the output of compensation op amp 420 may directly form primary winding signal 461.

As shown in FIG. 4, lead compensation network may comprise capacitors C41, C42, and C43 and resistors R41, R42. In this configuration any ramp voltage on the output of the drive amplifier circuit 425 due to the compensating action of compensation op amp 420 (i.e., current produced when the magnetizing current of the isolated analog selector transformer inductance is ramping up) may cause a direct current to flow through capacitor C43 and resistor R42, which may produce a direct current voltage drop across resistor R42. The direct current voltage drop on resistor R42 may block direct current through C42 and resistor R41. As such, compensation op amp 420 may be stabilized properly with lead compensation network 415 without introducing error due to direct current flowing through resistor R41.

As primary winding 460 is driven by the output of compensation op amp 420 and drive amplifier circuit 425, a substantially equivalent output signal may be produced on sense winding 462. This signal may pass through lag compensation network 430 which may comprise a series resistor R43 and capacitor C44. The compensated signal may then flow to the positive input of compensation op amp 420, creating a negative feedback loop since the polarity of the sense winding 462 may be reversed from that of primary winding 460.

As primary winding 460 is driven by the output of compensation op amp 420 and drive amplifier circuit 425, a substantially linear equivalent of the filtered analog input signal 413 may be produced on signal winding 464 through isolation barrier 452. The output on signal winding 464 may pass through snubber/output filter network 480. Snubber/output filter network 480 may be comprised of capacitors C45, C46, and C47 and resistors R48, R49. Capacitor C45 may create a high frequency filter in combination with the winding resistance of signal winding 464. Resistor R48 and capacitor C46 may form a stabilizing snubber to de-Q the compensation op amp circuitry parasitics. Resistor R49 and capacitor C47 may provide an additional low pass filter pole to increase immunity to common mode transients.

The compensation op amp 420 and class B amplifier T41, T42, resistances R41-R49, and capacitances C41-C47 may be chosen such that the output voltage 482 may be settled within one count of an A/D converter. Alternatively, or in addition, the settle time of isolated analog selector circuit 414 may correspond to (e.g., be less than or equal to time differential 353 of FIG. 3a). In one embodiment, the resistance values shown in Table 1 and capacitance values of Table 2 may be used to obtain the desired settling time:

TABLE 1

| FIG. 4 Resistance Values | |
|---|---|
| R41 | 5 KΩ |
| R42 | 10 KΩ |
| R43 | 499 Ω |
| R44 | 1 Ω |
| R45 | 1 Ω |
| R47 | 499 Ω |
| R48 | 340 Ω |
| R49 | 1 KΩ |

TABLE 2

| FIG. 4 Capacitance Values | |
|---|---|
| C41 | 47 pF |
| C42 | 47 pF |
| C43 | 47 pF |
| C44 | 220 pF |
| C45 | 22 pF |
| C46 | 1000 pF |
| C47 | 100 pF |

In the FIG. 4 embodiment, compensation op amp 420 may comprise an OPA357 operational amplifier, flip-flop F41 may comprise a 74LV374 positive edge trigger three-state flip-flop, and comparator CM41 may comprise a TL331 single differential comparator.

It should be understood that the analog selector circuit and associated control signals, analog multiplexer, and A/D converter disclosed herein could be used with any number of isolating transformers known in the art comprised of virtually any winding and/or magnetic core material known in the art including, but not limited to, ferrite, iron, or the like. As such, the above described system should not be read as limited to any particular isolating transformer implementation.

It will be obvious to those having skill in the art that many changes may be made to the details of the above-described embodiments without departing from the underlying principles of the invention. The scope of the present invention should, therefore, be determined only by the following claims.

I claim:

1. An apparatus for isolating an input analog signal, comprising:
   an isolated transformer comprising a primary winding, a sense winding in electromagnetic communication with the primary winding, and a signal winding in electromagnetic communication with the primary winding, wherein the signal winding is isolated from the primary winding by an isolation barrier of the isolated transformer; and
   an operational amplifier having a first input comprising a combination of the analog input signal and a primary winding signal and a second input comprising a sense winding signal derived from an output of the sense winding,
   wherein the primary winding signal comprises an output of the operational amplifier, and wherein the signal winding is configured to produce an output analog signal corresponding to the input analog signal at a capture time, wherein the operational amplifier is configured to drive the primary winding at time differential before the capture time, and wherein the time differential is sufficient to allow the compensation amplifier and output analog signal to settle.

2. The apparatus of claim 1, further comprising a drive amplifier disposed between the compensation operational amplifier and primary winding, wherein an input of the drive amplifier is electrically coupled to the output of the operational amplifier, and wherein the drive amplifier is configured to generate the primary winding signal.

3. The apparatus of claim 2, wherein the drive amplifier comprises a selectable bias in electrical communication with the drive amplifier to alternatively bias the drive amplifier to a positive bias voltage or a negative bias voltage to reduce an output impedance of the drive amplifier.

4. The apparatus of claim 3, wherein the selectable bias is selectable to a tri-state to unload the selectable bias from the primary winding.

5. The apparatus of claim 2, further comprising a snubber in electrical communication with the signal winding, wherein the snubber is configured to stabilize the compensation operational amplifier and the drive amplifier.

6. The apparatus of claim 1, further comprising a low-pass filter in electrical communication with the input analog signal and operational amplifier, wherein the low-pass filter is configured to generate a filtered analog input signal, and wherein the first input of the compensation operational amplifier comprises a combination of the filtered analog input signal and the primary winding signal.

7. The apparatus of claim 1, further comprising a lag compensation network in electrical communication with the sense winding and the operational amplifier, wherein an output of the sense winding flows through the lag compensation network, and wherein the second input of the operational amplifier comprises an output of the lag compensation network.

8. The apparatus of claim 1, further comprising a lead compensation network in electrical communication with the input analog signal, the primary winding signal, and the operational amplifier, wherein the input analog signal and the primary winding signal flow through the lead compensation network, and wherein the first input of the operational amplifier comprises an output of the lead compensation network.

9. The apparatus of claim 8, wherein the lead compensation network is configured to block magnetizing current produced on the primary winding from introducing error on the first input of the compensation operational amplifier.

10. The apparatus of claim 1, further comprising a lead-lag compensation network comprising a lag compensation network in electrical communication with the sense winding and the operation amplifier, and a lead network in electrical communication with the input analog signal, the primary winding signal, and the operational amplifier, wherein an output of the sense winding flows through the lag compensation network, and wherein the input analog signal and the primary winding signal flows through the lead compensation network, and wherein the first input of the operational amplifier comprises an output of the lead compensation network, and the second input of the operational amplifier comprises an output of the lag compensation network, and wherein the lead compensation network is configured to block magnetizing current produced on the primary winding from introducing error on the first input of the compensation operational amplifier.

11. The apparatus of claim 10, further comprising:
    a power supply winding in electromagnetic communication with the signal winding; and
    a power supply in electrical communication with the power supply winding, wherein the signal winding is isolated from the power supply winding and power supply by the isolation barrier.

12. The apparatus of claim 11, further comprising a rail switch in electrical communication with the signal winding.

13. The apparatus of claim 12, wherein the rail switch is configured to generate alternating pulses on the power supply winding through the signal winding, and wherein the power supply uses the alternating pulses to generate power.

14. The apparatus of claim 13, wherein the power supply comprises energy storage.

15. The apparatus of claim 14, wherein the power supply is in electrical communication with the compensation operational amplifier and is configured to provide power thereto.

16. The apparatus of claim 15, further comprising a trigger communicatively coupled to the power supply winding.

17. The apparatus of claim 16, wherein the trigger is configured to detect a high-frequency oscillation on the power supply winding.

18. The apparatus of claim 17, wherein the trigger is configured to assert an enable input of the compensation operational amplifier responsive to the detecting, and wherein the power supply is configured to power the compensation operational amplifier when the operational amplifier is so enabled.

19. A device for isolating an analog input signal across an isolation barrier of an isolation transformer comprising a primary winding, a sense winding, a power supply winding, and a signal winding, wherein the primary winding is in electromagnetic communication with the sense winding and the signal winding, and wherein the signal winding is in electromagnetic communication with the power supply winding, and wherein the signal winding is isolated from the other transformer windings by the isolation barrier, the device comprising:
   a lag compensation network in electrical communication with an output of the sense winding;
   a lead compensation network in electrical communication with the analog input signal and an output of a drive amplifier;
   an operational amplifier having a first input and a second input, wherein the first input of the operational amplifier is in electrical communication with an output of the lag compensation network and the second input of the operational amplifier is in electrical communication with an output of the lead compensation network; and a drive amplifier in electrical communication with an output of the operational amplifier and the primary winding, wherein the drive amplifier drives the primary winding with the output of the operational amplifier;

a power supply to power the drive amplifier and operational amplifier across the isolation barrier; and a snubber network in electrical communication with the sense winding configured to stabilize the operational amplifier, wherein an output of the snubber is a substantially linear equivalent of the input analog signal.

20. The device of claim 19, further comprising:

a supply voltage switch configured to alternately drive the signal winding to produce alternating pulses on the power supply winding, and wherein the power supply generates power using the alternating pulses.

21. The device of claim 20, wherein the power supply comprises means for storing electrical energy, the device further comprising:

a trigger in electrical communication with the power supply winding, wherein the trigger is configured to detect a control signal on the power supply winding, and wherein the trigger enables the operational amplifier and drive amplifier for an enable period responsive to detecting the control signal, and wherein the power supply is configured to provide power to the drive amplifier and operational amplifier responsive to the detecting.

22. The device of claim 21, further comprising capture circuitry to capture the output analog signal, wherein the capture circuitry captures the output analog signal during the enable period after a settling time to allow the operational amplifier, driver amplifier, lag compensation network, and lead compensation network to settle.

23. A system for isolating and capturing a plurality of analog signals, comprising:

a plurality of isolated analog circuits, wherein each isolated analog circuit comprises:

an isolation transformer comprising an isolation barrier to isolate a signal winding from a primary winding and a sense winding, wherein the primary winding is in electromagnetic communication with the sense winding and signal winding, a power supply to generate power from a power supply winding of the isolation transformer, wherein the power supply winding and is isolated from and in electromagnetic communication with the signal winding, a drive amplifier to drive the primary winding, and an operational amplifier having a first input comprising a combination of the analog input signal and an output of the drive amplifier and a second input comprising a signal derived from an output of the sense winding, the operational amplifier in electrical communication with the drive amplifier such that the drive amplifier drives the primary winding with an output of the operational amplifier, wherein the drive amplifier and operational amplifier have an enable input and are in electrical communication with the power supply;

an analog multiplexer communicatively coupled to the output of each of the plurality of isolated analog circuits;

a control signal generator to select one of the plurality of multiplexer inputs and to cause the drive amplifier and operational amplifier of the selected isolated analog circuit to be enabled; and capture circuitry configured to capture an analog signal selected by the analog multiplexer, wherein the capturing occurs after the drive amplifier and operational amplifier of selected isolated analog circuit are enabled and have settled.

24. A method for controlling an isolated analog selector circuit comprising an operational amplifier, a drive amplifier, a power supply, and an isolation transformer comprised of an isolation barrier, a primary winding, a sense winding, and a power supply winding isolated from a signal winding by the isolation barrier, wherein the signal winding is in electromagnetic communication with the primary winding and power supply winding, the method comprising:

providing a first set of control signals to cause the isolated analog selector circuit to operate in a first operational mode, wherein in the first operation mode the signal winding provides power to the power supply across the isolation barrier using the power supply winding;

providing a second set of control signals to cause the isolated analog selector circuit to operate in a second operational mode, wherein in the second operational mode the operational amplifier and drive amplifier are enabled and produce a substantially linear equivalent output signal on the signal winding using negative feedback generated on the sense winding; and providing a third set of control signals to cause the isolated analog selector circuit to operate in a third operational mode, wherein in the third operational mode the primary winding is unloaded from the compensation operational amplifier and drive amplifier to allow the primary winding to reset a core of the isolated transformer.

25. A method for producing an isolated linear equivalent output signal of an analog input signal, the method comprising:

alternately driving a signal winding of a isolated transformer to create alternating pulses on a power supply winding of the isolating transformer, the power supply winding in electrical communication with a power supply to generate and store power responsive to the pulses;

driving a primary winding of an isolation transformer with a drive amplifier circuit having a selectable positive or negative bias to reduce an output impedance of the drive amplifier circuit, wherein the input of the drive amplifier circuit is formed by a compensation operational amplifier;

stabilizing the compensation operational amplifier and drive amplifier with a lead-lag network, wherein the output of the compensation operational amplifier corresponds to a difference between a lag compensated signal from a sense winding of the isolation transformer in electromagnetic communication with the primary winding and a lead compensated output of the drive amplifier and input analog signal, wherein the lead compensation network blocks a magnetizing current produced by the primary winding from introducing error on the lead compensation output; and capturing a sample of a substantially linear equivalent of the input analog signal produced on the signal winding of the isolated transformer using capture circuitry, wherein the capturing occurs after the operational amplifier, drive amplifier, and lead-lag network have substantially settled.

* * * * *